United States Patent [19]

Dupuis et al.

[11] 4,053,824

[45] Oct. 11, 1977

[54] METHOD AND DEVICE FOR CHECKING A STORAGE BATTERY

[75] Inventors: Jean-Michel Dupuis, Gennevilliers; Pierre Lasserre, Nanterre, both of France

[73] Assignee: Compagnie Europeenne d'Accumulateurs S.A., Paris, France

[21] Appl. No.: 708,452

[22] Filed: July 26, 1976

[30] Foreign Application Priority Data

July 30, 1975 France .............................. 75.2382

[51] Int. Cl.² ........................................... G01N 27/42
[52] U.S. Cl. ..................................... 324/29.5; 320/48; 324/30 R
[58] Field of Search ................... 324/29.5, 30 R, 30 B; 320/48

[56] References Cited

U.S. PATENT DOCUMENTS

| 3,315,140 | 4/1967 | Dadin | 320/48 |
| 3,942,104 | 3/1976 | Byrne | 324/30 R |

*Primary Examiner*—M. Tokar
*Attorney, Agent, or Firm*—Sughrue, Rothwell, Mion, Zinn and Macpeak

[57] ABSTRACT

A battery of series-connected storage cells is checked by:
measuring the transient elementary open-circuit voltage at the terminals of each storage cell;
comparing the said elementary voltages with the average transient voltage of the said storage cells (i.e. with the total transient open-circuit voltage divided by the number of storage cells). The battery is rejected if the difference between the said average transient voltage and one of the said elementary transient voltage becomes greater than a predetermined threshold.

4 Claims, 4 Drawing Figures

METHOD AND DEVICE FOR CHECKING A STORAGE BATTERY

BACKGROUND OF THE INVENTION

1. Field of the Invention

The present invention relates to a method and a device for checking a storage battery, more particularly a lead acid storage battery, charged and filled with electrolyte, this checking being effected in principle when the battery comes off the production line.

2. Description of the Prior Art

Known means which are used at present for detecting electrical defects which have not been detected during checks made at intermediate stages of production are of two types:

Firstly, devices for measuring the voltage of the batteries at the end of the forming and charging phase enable the rejection of the battery whose-end-of charge voltage is lower than a predetermined thereshold ; and Secondly, rapid discharge devices require the rejection of batteries whose voltage is insufficient after a few seconds of discharge.

These means are generally completely insufficient for detecting small or medium internal short-circuits and even large short circuits, which can be detected by conventional checking methods only after long storage or service periods.

Preferred embodiments of the present invention enable electrical defects such as short circuits to be detected after charging ie; during battery finishing operations.

SUMMARY OF THE INVENTION

The present invention provides a method of checking a battery of series connected storage cells, comprising the following operations:

an elementary transient open circuit voltage is measured at the terminals of each storage cell (ie;

The said elementary voltages are compared with the average transient voltages of the said storage cells (ie with the total transient open circuit voltage devided by the number of storage cells);

The battery is rejected if the difference between the said average transient voltage and one of the said elementary transient voltages is greater than a predetermined threshold.

In the method according to the invention, the transient voltage of a storage cell to be tested is compared, not with that of a standard storage cell, but with the average transient voltage of all the cells of the battery to which it belongs; thus in each battery, the average theoretical cell is assimilated to a normal reference cell.

The existence of an electric defect in a storage cell results in a difference in transient voltage which is greater in proportion the magnitude of the threshold value is chosen as a function of the least defect which it is necessary to detect.

The measurement of transient voltages in an open circuit can be effected continuously or at predetermined instants in a period counted from the end of charging and ranging from a few tens of minutes to ten or so hours, a period of about one hour being preferable.

The invention also provides a device enabling the implementing of the above method.

Embodiments of the invention are described by way of example with reference to the accompanying drawings:

DESCRIPTION OF THE PREFERRED EMBODIMENT

The examples described below in which like elements carry like numeral designations, concern 12 volt lead acid batteries, containing 6 2-volt cells connected in series and having a capacity of 40 Ah in 20 hours. These batteries have been checked at ambient temperature as they came off the producting line.

Figure 1:
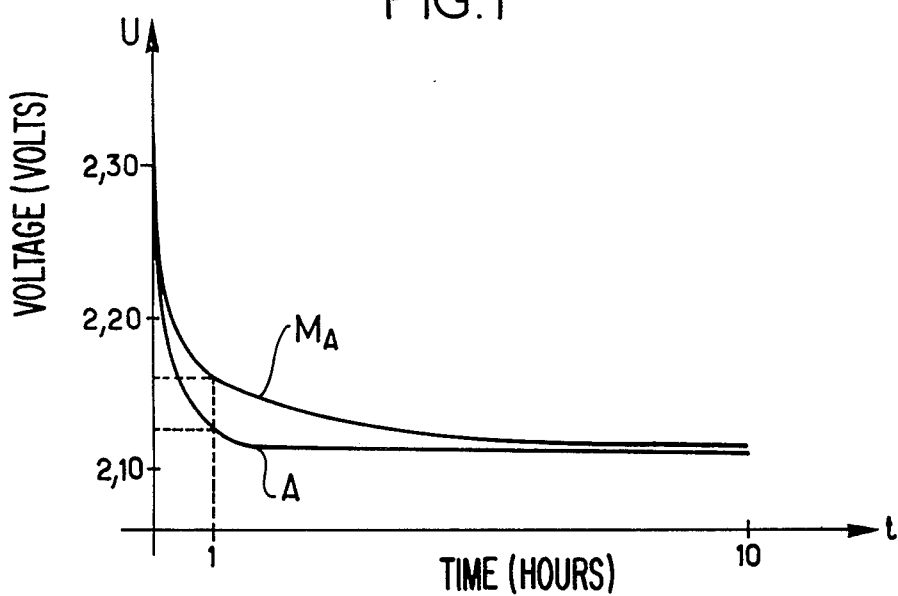
FIGS. 1 and 2 are graphs showing transient voltage curves in an open circuit U (volts) as a function of time $t$ (hours) of a defective storage cell and of an average reference storage cell.

FIG. 1 shows curves A and MA which are representative of the variations as a function of time of transient voltage $U_A$ and $U_{MA}$ in an open circuit respectively of a defective cell and of an average reference cell.

The stabilisation of the open circuit potential of a lead acid storage cell which has just been completely charged requires twenty or so hours at ambient temperature. This slow rate of stabilisation is due entirely to the positive electrode, the negative potential actually finding its balance value very rapidly, practically in less than a minute.

The comparison between $U_A$ and $U_{MA}$, according to the method of the invention, shows a difference $U_{MA} - U_A$; the battery is rejected if this difference becomes higher than a predetermined threshold. The case of FIG. 1, shows a medium sized short circuit, in the order of about 100 mA.

Figure 2:
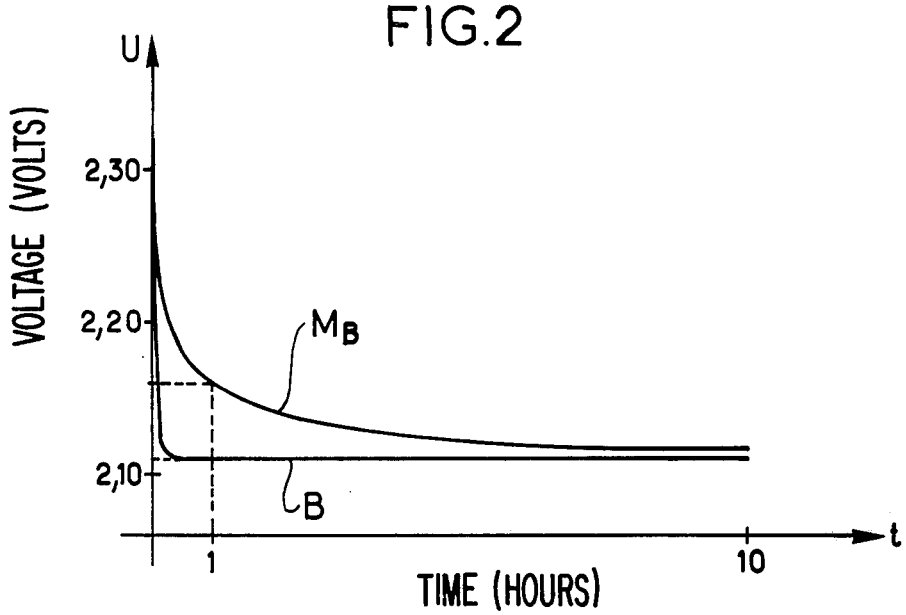

The FIG. 2 shows curves B and MB which are representative of the variations as a function of time of the transient voltage UB and UMB respectively of a defective cell and of the average reference cell. In the case of this figure, the short-circuit current is high, in the order of about 1A and the stabilisation of the potential of the element in an open circuit is appreciably accelerated in comparison with the case in FIG. 1.

The point measurement can also be made in a period ranging from a few tens of minutes to about 10 hours. In practice, a measurement after one hour will be sufficient in most cases.

To implement the method according to the invention practically, the open circuit transient voltage of a cell to be tested is compared, not with that of a standard cell, but with the average open circuit transient voltage of all the cells of the battery to which the cell belongs. For this purpose, the device to be used is shown schematically in FIG. 3 and is intended for checking a battery 1 of storage cells 10 to 15 whose intermediate electrical connections 20 to 24 are accessible from the outside. A charging pulse generator 17 is connected to the terminals 2 and 3 of the battery 1. Voltage detectors represented by a block 4 are connected between the terminals of the cells and send signals U1 to U6. The computer 5 determines the average open circuit transient voltage $$U_M = \frac{U_1 + \ldots + U_6}{6},$$

and addresses signals to a comparator 6 which signals are significant of the deviations $U_M$-$U_i$ (i ranging from 1 to 6).

The comparator 6 provides an output signal if $U_M$-$U_i$ becomes greater than a predetermined threshold $U_o$; a display element 7 is connected to the output of the comparator 6.

Figure 4:
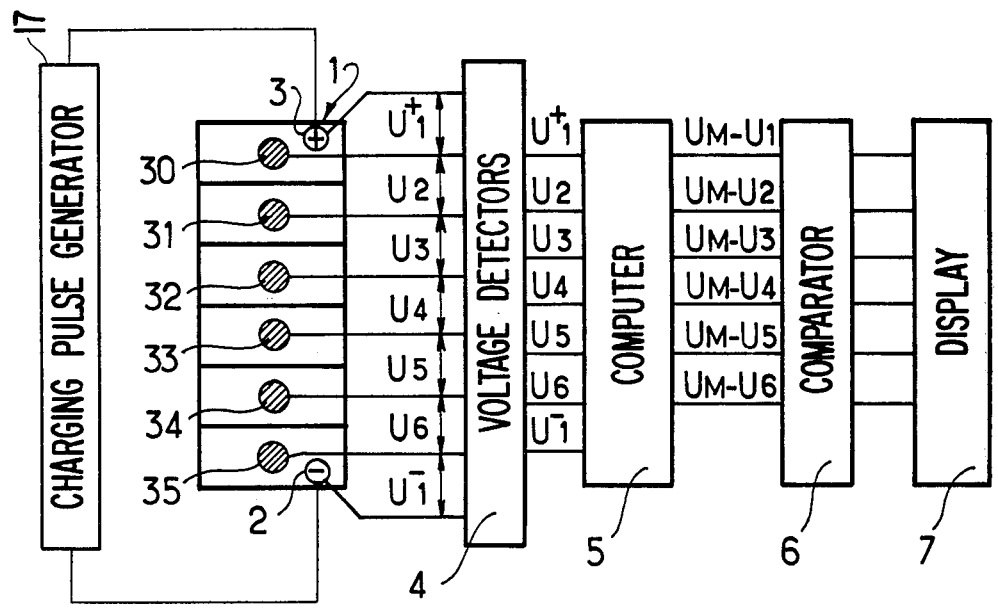
FIG. 4 is a schematic block diagram of an analogous device to the one of FIG. 3, but suitable for checking batteries whose electric connections are not externally accessible.

In the case where the intermediate electric connections 20 to 24 of the cells 10 to 15 are not externally accessible the method according to the invention can be implemented by means of the device shown schematically in FIG. 4.

Reference electrodes 30 to 35 (which are, for example, mercury-mercurous sulphate electrodes) are inserted in the filling orifices of the cells. Each voltage $U_2$ to $U_6$ measured between two consecutive ones of the reference electrodes corresponds to the potential difference existing between the positive plates of a first cell and the negative plates of a second (or vice versa). The voltage $U_1$ defined previously is equal, here, to $U_1^+ + U_1^-$, $U_1^+$ being the voltage measured between the positive terminal 3 of the battery and the electrode 30, $U_1^-$ being the voltage measured between the electrode 35 and the negative terminal 2. Thus the battery is rejected for a defect in the ith element if the difference $U_M$-$U_i$ becomes greater than a predetermined threshold, for the positive plates are practically exclusively responsible for the delay in the stabilisation of the potential in an open circuit.

Figure 3:
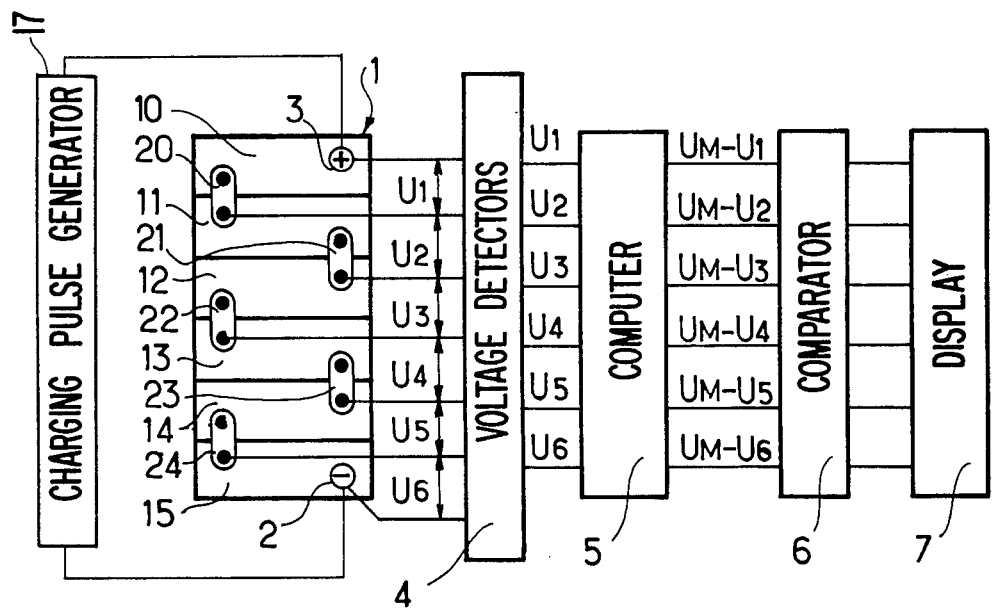
FIG. 3 is a schematic block diagram of a device for implementing the method according to the invention applied to a battery in which the cells have electric connections which are externally accessible.

The voltage signal processing elements coming from the computer 5 are analogous to those which appear in FIG. 3.

It must be understood that the invention is in no way limited to the embodiments described and illustrated, which have been given only by way of example. More particularly, without going beyond the scope of the invention, certain arrangements can be changed or certain means can be replaced by equivalent means

What is claimed is:

1. A method of checking a lead battery of series connected storage cells at the end of the battery production line, comprising the following steps, in order:
   fully charging said lead battery at the end of battery production;
   measuring an elementary transient open circuit voltage at the terminals of each storage cell in a time period from the end of charging which ranges from a few tens of minutes to about ten hours;
   comparing said elementary voltages with the average transient voltages of said storage cells; and
   rejecting the battery if the difference between said average transient voltage and one of said elementary transient voltages is greater than a predetermined threshold.

2. The method according to claim 1, wherein said point in time is about one hour.

3. The method according to claim 1, wherein said measuring step comprises taking point measurements.

4. A device for checking a fully charged lead battery of series connected storage cells at the end of the battery production line, wherein during a time period counted from the end of charging and ranging from a few tens of minutes to about ten hours, the elementary transient open circuit voltage at the terminals of each storage cell is measured and wherein said elementary voltages are compared with the average transient voltages of the storage cells, said device comprising:
   means for measuring an elementary transient open circuit voltage at the terminals of each storage cell;
   means for comparing said elementary voltages with the average transient voltage of said storage cells; and
   means for providing a rejection signal for the battery if the difference between the average transient voltage and one of said elementary transient voltages is greater than a predetermined threshold.

* * * * *